United States Patent
Kim et al.

(10) Patent No.: US 8,017,496 B2
(45) Date of Patent: Sep. 13, 2011

(54) METHODS OF MANUFACTURING A SEMICONDUCTOR DEVICE

(75) Inventors: Tae-Gyun Kim, Seoul (KR); Dong-Suk Shin, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 9 days.

(21) Appl. No.: 12/587,857

(22) Filed: Oct. 14, 2009

(65) Prior Publication Data

US 2010/0093166 A1    Apr. 15, 2010

(30) Foreign Application Priority Data

Oct. 15, 2008    (KR) .................. 10-2008-0101040

(51) Int. Cl.
   *H01L 21/76*    (2006.01)

(52) U.S. Cl. ........ 438/437; 438/423; 438/424; 438/425; 438/426; 438/433; 438/434; 438/435; 438/436; 438/438

(58) Field of Classification Search .......... 438/423–426, 438/433–438

See application file for complete search history.

(56) References Cited

U.S. PATENT DOCUMENTS

| | | | |
|---|---|---|---|
| 5,726,090 A * | 3/1998 | Jang et al. ............... | 438/435 |
| 5,891,787 A * | 4/1999 | Gardner et al. ........... | 438/424 |
| 6,251,735 B1 * | 6/2001 | Lou ............................... | 438/296 |
| 6,333,232 B1 * | 12/2001 | Kunikiyo ....................... | 438/296 |
| 6,576,558 B1 * | 6/2003 | Lin et al. ........................ | 438/700 |
| 6,780,730 B2 | 8/2004 | Lin | |
| 2002/0182826 A1 * | 12/2002 | Cheng et al. ................... | 438/433 |
| 2004/0142538 A1 * | 7/2004 | Takahashi ....................... | 438/424 |
| 2005/0142806 A1 * | 6/2005 | Song ............................. | 438/424 |
| 2006/0131689 A1 * | 6/2006 | Tsukidate ....................... | 257/506 |
| 2007/0026630 A1 * | 2/2007 | Kim et al. ....................... | 438/424 |
| 2007/0059900 A1 * | 3/2007 | Lai et al. ........................ | 438/435 |
| 2008/0254593 A1 * | 10/2008 | Eun et al. ....................... | 438/425 |

FOREIGN PATENT DOCUMENTS

| | | |
|---|---|---|
| KR | 2003-0002815 A | 1/2003 |
| KR | 10-2006-0023429 A | 3/2006 |

* cited by examiner

*Primary Examiner* — Kevin M Picardat
*Assistant Examiner* — Bac Au
(74) *Attorney, Agent, or Firm* — Onello & Mello, LLP.

(57) ABSTRACT

In a method of manufacturing a semiconductor device, a mask pattern is formed on an active region of a substrate. An exposed portion of the substrate is removed to form a trench in the substrate. A preliminary first insulation layer is formed on a bottom and sidewalls of the trench and the mask pattern. A plasma treatment is performed on the preliminary first insulation layer using fluorine-containing plasma to form a first insulation layer including fluorine. A second insulation layer is formed on the first insulation layer to fill the trench. A thickness of a gate insulation layer adjacent to an upper edge of the trench may be selectively increased, and generation of leakage current may be reduced.

15 Claims, 10 Drawing Sheets

METHODS OF MANUFACTURING A SEMICONDUCTOR DEVICE

CROSS-REFERENCE TO RELATED APPLICATIONS

This application claims priority under 35 U.S.C. §119 to Korean Patent Application No. 10-2008-0101040 filed on Oct. 15, 2008 in the Korean Intellectual Property Office (KIPO), the contents of which are herein incorporated by reference in their entirety.

BACKGROUND

1. Field

Exemplary embodiments relate to methods of manufacturing a semiconductor device. More particularly, exemplary embodiments relate to methods of manufacturing a semiconductor device, which reduce generation of leakage current.

2. Description of the Related Art

Semiconductor devices have been widely developed as information media are popularized. Semiconductor devices having a high operational speed and a large capacity are in demand. Manufacturing techniques for a semiconductor device have been developed to improve an integration degree and a response rate of a device. For example, various devices (e.g., a gate, a transistor, a capacitor and/or a diode) formed on a semiconductor substrate and an isolation layer for defining an active region and a field region have been formed to have reduced dimensions and to raise an integration degree.

Formation of an isolation layer is an early stage process in fabrication of a semiconductor device, and may have an influence on a dimension of an active region and a process margin of subsequent processes. The isolation layer may be generally formed by a local oxidation of silicon (LOCOS) process or a shallow trench isolation (STI) process.

In the LOCOS process, a mask is formed on an active region of a semiconductor substrate, and then an exposed portion of the semiconductor substrate is thermally oxidized. An isolation layer formed by the LOCOS process generally has a bird's beak at edges. An electric field may concentrate to the bird's beak edges, and thus a leakage current may be easily generated through the bird's beak edges. The LOCOS isolation layer may also be formed to invade the active region, so controlling or reducing a dimension of the active region may be difficult. In the STI process, a trench is formed by partially etching the semiconductor substrate, and then an isolation layer is formed by filling the trench with an insulation material. The STI process may overcome the bird's beak problem of the LOCOS process, and may be useful for fabricating a highly-integrated semiconductor device. As a width of the trench decreases and an aspect ratio of the trench increases, however, it may be difficult to form an isolation layer in the trench while reducing or suppressing generation of a void or a seam in the isolation layer.

While the dimensions of the isolation layer and the active region decrease, a size of a semiconductor device such as a gate has become smaller. When a physical dimension of a semiconductor device is reduced, electrical characteristics or reliability of the semiconductor device may be degraded. For example, a gate insulation layer having a relatively small thickness may have a relatively low barrier of charge tunneling, which may cause an increase of a leakage current. When a thickness of the gate insulation layer decreases, for example, to about 20 Å or less, charge tunneling may exponentially increase and a leakage current through the gate insulation layer may also greatly increase. Research for reducing a dimension of a semiconductor device overcoming such problems has been done, but a process for fabricating a reliable semiconductor device having a critical dimension of about 45 nm or less is still a problem to be solved.

SUMMARY

Exemplary embodiments provide a method of manufacturing a semiconductor device which improves integration degree and reduces generation of leakage current.

According to one aspect, the present inventive concept is directed to a method of manufacturing a semiconductor device. In the method, a mask pattern may be formed on an active region of a substrate. An exposed portion of the substrate may be removed to form a trench in the substrate. A preliminary first insulation layer may be formed on a bottom and sidewalls of the trench and the mask pattern. A plasma treatment may be performed on the preliminary first insulation layer using fluorine-containing plasma to form a first insulation layer including fluorine. A second insulation layer may be formed on the first insulation layer to fill the trench.

In exemplary embodiments, upper portions of the second insulation layer and the first insulation layer and the mask pattern may be removed until the active region of the substrate is exposed. A gate insulation layer may be formed on the active region of the substrate to have a center portion having a first thickness and an edge portion having a second thickness larger than the first thickness.

In exemplary embodiments, performing a plasma treatment on the preliminary first insulation layer may further include removing a portion of the preliminary first insulation layer near an upper edge of the trench.

In exemplary embodiments, a thickness of a first portion of the first insulation layer near the upper edge of the trench may be smaller than a thickness of a second portion of the first insulation layer near a bottom of the trench.

In exemplary embodiments, a thermal treatment may be performed on the substrate on which the first insulation layer is formed to fluorinate a surface and an upper edge of the trench.

In exemplary embodiments, the fluorine-containing plasma may include $NF_3$ gas plasma.

In exemplary embodiments, the preliminary first insulation layer is formed using $O_3$-tetraethyl orthosilicate. The preliminary first insulation layer may be formed by a sub atmospheric chemical vapor deposition process.

In exemplary embodiments, the first insulation layer may have a thickness of about 800 Å or less.

In exemplary embodiments, the second insulation layer is formed using $O_3$-tetraethyl orthosilicate.

In exemplary embodiments, a liner layer may be optionally formed on a bottom and sidewalls of the trench, before forming the preliminary first insulation layer in the trench. The liner layer may have a thickness of about 100 Å or less.

According to another aspect, the present inventive concept is directed to a method of manufacturing a semiconductor device. In the method, a mask pattern may be formed on an active region of a substrate. The active region may be lengthwise in a first direction. An exposed portion of the substrate may be removed to form a trench in the substrate, and a preliminary first insulation layer may be formed on a bottom and sidewalls of the trench and the mask pattern. A plasma treatment may be performed on the preliminary first insulation layer using fluorine-containing plasma to form a first insulation layer including fluorine. A second insulation layer may be formed on the first insulation layer to fill the trench. A thermal treatment may be performed on the substrate on which the first insulation layer and the second insulation layer are formed. Upper portions of the second insulation layer and the first insulation layer, and the mask pattern may be removed until the active region of the substrate is exposed. A gate insulation layer may be formed on the active region of the substrate. The gate insulation layer may include a center portion and an edge portion in a second direction perpendicular the first direction. The center portion of the gate insulation layer has a first thickness, and the edge portion of the gate insulation layer has a second thickness larger than the first thickness. A gate conductive layer may be formed on the gate insulation layer, and the gate conductive layer and the gate insulation layer may be patterned to form a gate structure lengthwise in the second direction.

In exemplary embodiments, the thermal treatment may be performed at a temperature sufficient for fluorinating a surface and an upper edge of the trench.

In exemplary embodiments, a thickness of a first portion of the first insulation layer near the upper edge of the trench may be smaller than a thickness of a second portion of the first insulation layer near a bottom of the trench.

In exemplary embodiments, the gate structure may have a line width of about 50 nm or less.

According to exemplary embodiments, an isolation layer that includes a first insulation layer having fluorine may be formed by performing a fluorine plasma treatment on a thin insulation layer formed along an inner wall of a trench. Fluorine components existing in portions of the first insulation layer near the upper edge of the trench may accelerate growth or deposition of a gate insulation layer formed near the upper edge portion of the trench. In some exemplary embodiments, fluorine in the first insulation layer may move to an adjacent surface of the substrate and the trench due to thermal activation, and in particular may reach up to an upper edge portion of the trench. In this case, fluorine near the upper edge of the trench may also enhance growth or deposition of a gate insulation layer formed near the upper edge portion of the trench. Therefore, a thickness of an edge portion of the gate insulation layer may selectively increase to reduce generation of leakage current.

Further, the first insulation layer formed by performing the fluorine plasma treatment may have a relatively small thickness near the upper edge portion of the trench. Therefore, a second insulation layer may be formed on the first insulation layer to readily fill the trench while suppressing generation of a void in the trench. In contrast with the fluorine plasma treatment of the invention, if fluorine were to be inserted into the preliminary first insulation layer by an ion implantation process, a thickness of the preliminary first insulation layer may not be substantially reduced, and an entrance of the trench in which the first insulation layer is formed may be relatively small. Therefore, the small entrance of the trench may be readily blocked while forming a second insulation layer in the trench and a void may be formed in the second insulation layer. Further, fluorine which may excessively remain on the substrate may be a contaminant causing malfunction of a device, and a dose amount and/or energy of ion implantation may not be precisely controlled, and the substrate or the trench may be unintentionally damaged. Thus, the fluorine plasma treatment according to the inventive concept provides a substantial advantage.

BRIEF DESCRIPTION OF THE DRAWINGS

The foregoing and other features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DETAILED DESCRIPTION OF EXEMPLARY EMBODIMENTS

Figure 1:
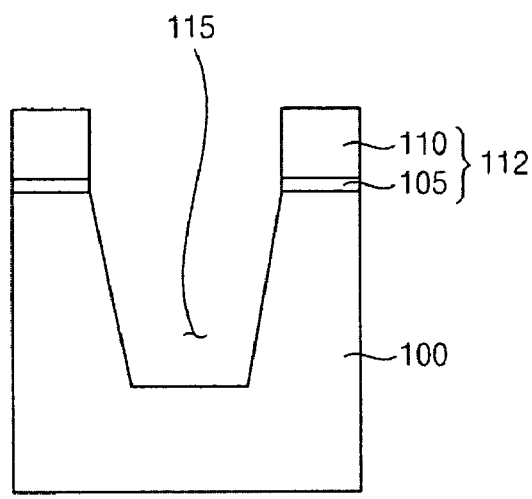
FIGS. 1 through 4 are cross-sectional views illustrating a method of forming an isolation layer according to exemplary embodiments.

Various exemplary embodiments will be described more fully hereinafter with reference to the accompanying drawings, in which some exemplary embodiments are shown. Exemplary embodiments may, however, be embodied in many different forms and should not be construed as limited to the exemplary embodiments set forth herein. Rather, these exemplary embodiments are provided so that this description will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it may be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of exemplary embodiments.

Spatially relative terms, e.g., "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms including technical and scientific terms used herein have the same meaning as commonly understood by one of ordinary skill in the art to which exemplary embodiments belongs. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

FIGS. 1 through 4 are cross-sectional views illustrating a method of forming an isolation layer according to exemplary embodiments.

Referring to FIG. 1, a substrate 100 having a trench 115 may be prepared. The substrate 100 may be a silicon substrate, a silicon-germanium substrate, a silicon on insulator (SOI) substrate, a germanium on insulator (GOI) substrate, a metal oxide single-crystalline substrate, etc. The trench 115 may be formed by partially etching the substrate 100. For example, a mask pattern 112 may be formed on the substrate 100, and then an exposed portion of the trench 115 may be etched using the mask pattern 112 as an etching mask to form the trench 115 in the substrate 100.

In exemplary embodiments, the mask pattern 112 may include a pad oxide layer pattern 105 and a pad nitride layer pattern 110. A pad oxide layer and a pad nitride layer may be sequentially formed on the substrate 100, and then a photolithography process using photoresist may be performed on the pad nitride layer and the pad oxide layer to form the pad nitride layer pattern 110 and the pad oxide layer pattern 105 on the substrate 100. The pad oxide layer may relieve stress between the pad nitride layer and the substrate 100. In exemplary embodiments, the pad oxide layer may be formed by a thermal oxidation process or a chemical vapor deposition (CVD) process using silicon oxide. The pad nitride layer may be formed using silicon nitride by a CVD process, a low pressure chemical vapor deposition (LPCVD) process or a plasma enhanced chemical vapor deposition (PECVD) process.

The trench 115 may be formed in the substrate 100 by performing an etching process on the substrate 100 having the mask pattern 112. The trench 115 may be formed to have predetermined width and depth. An isolation layer may be formed in the trench 115 by a subsequent process, and the substrate 100 may be divided into an active region and a field region. The active region may be a portion of the substrate 100, and a semiconductor device may be formed in the active region. In exemplary embodiments, the trench 115 may be formed to have a width of about 5 nm to about 1 μm. In other exemplary embodiments, the width of the trench 115 may be about 10 nm to about 100 nm. In still other exemplary embodiments, the width of the trench 115 may be about 90 nm or less, about 60 nm or less, about 50 nm or less, about 45 nm or less, about 40 nm or less, about 30 nm or less, or about 20 nm or less.

Figure 2:
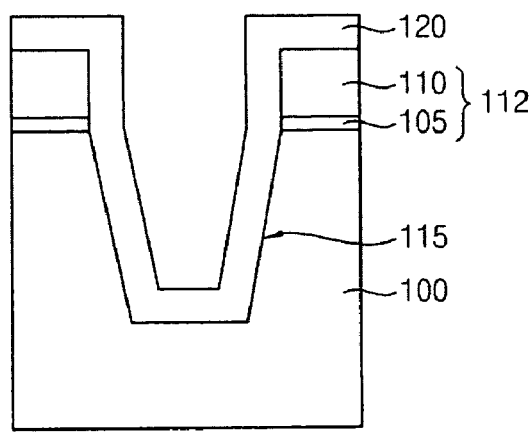

Referring to FIG. 2, a preliminary first insulation layer 120 may be formed on a sidewall and a bottom of the trench 115 and the mask pattern 112. The preliminary first insulation layer 120 may be formed along surfaces of the trench 115 and the mask pattern 112 by incompletely filling the trench 115 with an insulation material. The preliminary first insulation layer 120 may be in contact with the substrate 100 at a bottom and sidewalls of the trench 115.

In exemplary embodiments, the preliminary first insulation layer 120 may be formed using $O_3$-tetraethyl orthosilicate ($O_3$-TEOS). For example, the preliminary first insulation layer 120 may be formed by depositing $O_3$-TEOS using a sub-atmospheric chemical vapor deposition (SACVD) process. The preliminary first insulation layer 120 formed using $O_3$-TEOS may be formed along a profile of the trench 115 to have a relatively constant thickness, and thus a generation of a void in an isolation layer formed in the trench 115 may be reduced. In other exemplary embodiments, the preliminary first insulation layer 120 may be formed using an oxide (e.g., phosphosilicate glass (PSG), borophosphosilicate glass (BPSG), undoped silicate glass (USG), spin on glass (SOG), tetraethyl orthosilicate (TEOS), plasma enhanced-TEOS (PE-TEOS), high density plasma-chemical vapor deposition (HDP-CVD) oxide, etc.). In still other exemplary embodiments, the preliminary first insulation layer 120 may be formed to include silicon oxide, silicon oxynitride, silicon nitride or combinations thereof.

In exemplary embodiments, the preliminary first insulation layer 120 may be formed using an oxide to have a thickness of about 800 Å or less (e.g., about 200 Å to about 800 Å). In other exemplary embodiments, the preliminary first insulation layer 120 may be formed to have a thickness of about 300 Å to about 700 Å.

In other exemplary embodiments, the mask pattern 112 may be removed from the substrate 100 before forming the preliminary first insulation layer 120 on the substrate 100. In this case, the preliminary first insulation layer 120 may be formed on a sidewall and a bottom of the trench 115 and the active region of the substrate 100. When the mask pattern 112 remains on the substrate 100, the mask pattern 112 may protect the active region of the substrate 100 during a subsequent process (e.g., a plasma treatment).

Figure 3:
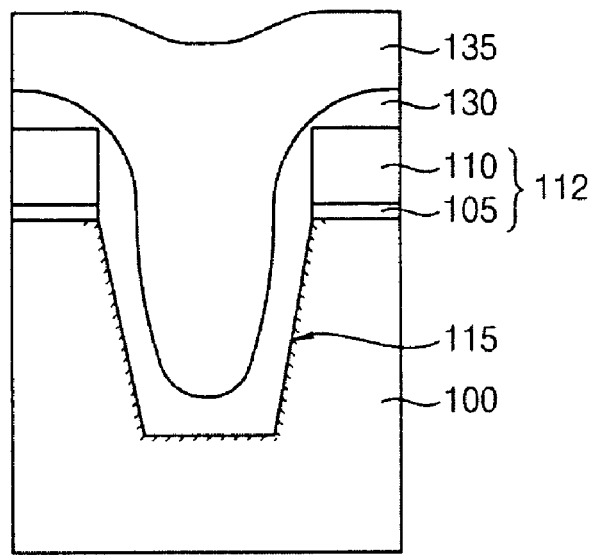

Referring to FIG. 3, a fluorine plasma treatment may be performed on the substrate 100 on which the trench 115 and the preliminary first insulation layer 120 may be formed. The plasma treatment may be performed using fluorine-containing plasma. By treating the preliminary first insulation layer 120 with fluorine-containing plasma, the preliminary first insulation layer 120 may be converted into a first insulation layer 130 including fluorine. The first insulation layer 130 may be an element of an isolation layer 140 (see FIG. 4). Fluorine included in the first insulation layer 130 may accelerate deposition or growth of an insulation layer (e.g., an oxide or an oxynitride) on the active region of the substrate 100 adjacent to the trench 115, and thus a portion the insulation layer adjacent the first insulation layer 130 may have a thickness larger than a thickness of a portion of the insulation layer spaced apart from the first insulation layer 130.

In exemplary embodiments, the fluorine-containing plasma may be $NF_3$ gas plasma. In the $NF_3$ gas plasma, nitrogen and fluorine may be readily separated, and thus fluorine may be efficiently inserted into the preliminary first insulation layer 120. In other exemplary embodiments, the fluorine-containing plasma may be plasma including $CF_4$, $C_2F_6$, $C_3F_8$, $C_4F_8$, $CF_3H$, $CF_2H_2$, $SF_6$, $CF_3Cl$ or combinations thereof. As compared with $NF_3$ gas plasma, carbon and fluorine may not be easily separated in CFx-based gas plasma, and remaining carbon on the substrate 100 may be unintended contaminants causing malfunction of a device.

In exemplary embodiments, the first insulation layer 130 may have a thickness smaller than that of the preliminary first insulation layer 120, since the preliminary first insulation layer 120 may be partially removed while performing the plasma treatment. In some embodiments, the first insulation layer 130 may have a thickness of about 50 Å to about 700 Å smaller than that of the preliminary first insulation layer 120. In other example embodiments, the first insulation layer 130 may have a thickness of about 800 Å or less.

In other exemplary embodiments, a thickness reduction of the preliminary first insulation layer 120 may be concentrated on a portion adjacent to upper edges of the trench 115 while treating the preliminary first insulation layer 120 with fluorine plasma. Accordingly, a thickness of a portion of the first insulation layer 130 adjacent to or near upper edges of the trench 115 may be smaller than a thickness of a portion of the first insulation layer 130 adjacent to or near a bottom of the trench 115. The fluorine plasma treatment may enlarge an entrance of a space in the trench 115 in which the preliminary first insulation layer 120 is formed, as illustrated in FIGS. 2 and 3. Thus, a second insulation layer 135 may be readily formed on the first insulation layer 130 and in the trench 115 through the enlarged entrance, and generation of a void in the trench 115 having a high aspect ratio may be reduced.

Alternatively, inserting fluorine into the preliminary first insulation layer 120 may be performed by an ion implantation process. In a fluorine ion implantation process, however, a dose amount and/or energy of ion implantation may not be precisely controlled, and the substrate 100 or the trench 115 may be unintentionally damaged. Doped fluorine which may excessively remain on the substrate 100 may be contaminants causing malfunction of a device. Further, a thickness of the preliminary first insulation layer 120 may not be substantially reduced by the ion implantation process, and entrance of the trench 115 in which the preliminary first insulation layer 120 formed may not be enlarged. Therefore, the small entrance of the trench 115 may be readily blocked while forming a second insulation layer 135 in the trench 115 and a void may be formed in the second insulation layer 135.

Referring to FIG. 3, the second insulation layer 135 may be formed on the first insulation layer 130 to fill the trench 115 of the substrate 100. The second insulation layer 135 may be readily formed in the trench 115 through a relatively large entrance, and generation of a void in an insulation layer filling the trench 115 may be avoided. The second insulation layer 135 may be formed using an insulation material the same as or different from that of the preliminary first insulation layer 120. In exemplary embodiments, the second insulation layer 135 may be formed using $O_3$-TEOS. In other exemplary embodiments, the second insulation layer 135 may be formed using PSG, BPSG, USG, SOG, TEOS, PE-TEOS and/or HDP-CVD oxide. In still other exemplary embodiments, the second insulation layer 135 may be formed using silicon oxide, silicon oxynitride, silicon nitride or combinations thereof.

In exemplary embodiments, the second insulation layer 135 may be formed to have a thickness of about 2,000 Å to about 8,000 Å. In other exemplary embodiments, the second insulation layer 135 may be formed to have a thickness of about 4,000 Å to about 6,000 Å.

In some exemplary embodiments, a thermal treatment may be performed on the substrate 100 on which the first insulation layer 130 and the second insulation layer 135 are formed. The thermal treatment may enhance density and insulation characteristics of the first insulation layer 130 and the second insulation layer 135. During the thermal treatment process, fluorine of the first insulation layer 130 may move toward an adjacent portion of the substrate 100 so that a surface of the substrate 100 positioned at upper edges, sidewalls and/or a bottom of the trench 115 may be fluorinated. When the mask pattern 112 remains on the substrate 100, the upper edges of the trench 115 may be fluorinated, but a center surface of the active region of the substrate 100 may not be fluorinated during the thermal treatment. For example, the thermal treatment may be performed at a temperature of about 500° C. to about 1,100° C. under an atmosphere of $N_2$, Ar, and/or OH radical. The thermal treatment may be performed at a temperature of about 900° C. to about 1,100° C. The thermal treatment may be performed for about 3 hours or less.

In other exemplary embodiments, the thermal treatment may be performed on the substrate 100 on which the first insulation layer 130 is formed, before forming the second insulation layer 135 on the first insulation layer 130. The second insulation layer 135 may be formed on the thermally treated first insulation layer 130.

Figure 4:
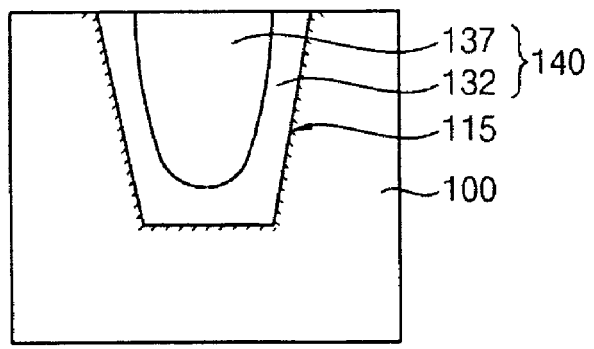

Referring to FIG. 4, upper portions of the second insulation layer 135 and the first insulation layer 130 and the mask pattern 112 may be removed from the substrate 100 so that a portion of the substrate 100 may be exposed. By removing the upper portions of the second insulation layer 135 and the first insulation layer 130, an isolation layer 140 including a second insulation layer pattern 137 and a first insulation layer pattern 132 may be formed in the trench 115.

In exemplary embodiments, removing the upper portions of the second insulation layer 135 and the first insulation layer 130 and the mask pattern 112 may be performed by a planarization process, a wet etching process and/or a dry etching process. For example, a chemical mechanical polishing process may be performed on the second insulation layer 135, the first insulation layer 130 and the mask pattern 112 until an upper face of the substrate 100 (i.e., the active region) is exposed. In other exemplary embodiments, a chemical mechanical polishing process may be performed until at least a portion of the mask pattern 112 remains on the substrate 100, and then the mask pattern 112 may be removed by a wet etching process.

In some exemplary embodiments, an upper face of the isolation layer 140 may be formed to have a height level similar to that of the active region. In other exemplary embodiments, the isolation layer 140 may be relatively protruded from the active region of the substrate 100. In still other exemplary embodiments, the isolation layer 140 may be relatively depressed or recessed from the active region of the substrate 100. The relative height of the isolation layer 140 may be adjusted by a planarization process and/or an etching process.

In exemplary embodiments, a surface of the trench 115 may be fluorinated by performing a thermal treatment on the first insulation layer 130 and the second insulation layer 135, and then the isolation layer 140 may be formed in the trench 115 having fluorinated sidewalls and upper edges. Fluorine existing near the upper edges of the trench 115 and the first insulation layer 130 may accelerate growth or formation of an insulation layer (e.g., a gate insulation layer or a tunnel oxide layer) on the upper edges of the trench 115. Accordingly, an edge portion of an insulation layer formed on the fluorinated upper edges of the active region may have a thickness substantially larger than a thickness of a center portion of the insulation layer formed on a non-fluorinated center top of the active region. The insulation layer having a relatively thick edge portions may be provided as a gate insulation layer of a gate structure, or a tunnel oxide layer of a flash memory device. The insulation layer having a relatively thick edge portions may be employed in a semiconductor device having a high integration degree and a very small critical dimension so that generation of a leakage current may be greatly reduced.

Fluorinating the trench 115 may be performed by an ion implantation process in other embodiments. In a fluorine ion implantation, fluorine ions may be implanted into the trench 115 directly or through an intermediate insulation layer. However, doped fluorine that excessively remains on the substrate 100 may be contaminants causing malfunction of a device. A dose amount and/or energy of ion implantation may not be precisely controlled, and the substrate 100 or the trench 115 may be unintentionally damaged.

Figure 5:
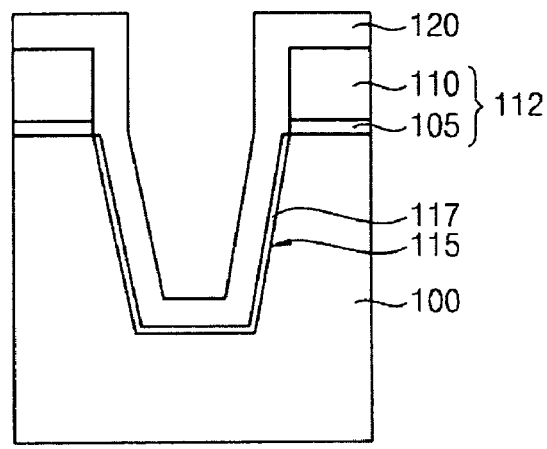
FIGS. 5 through 7 are cross-sectional views illustrating a method of forming an isolation layer according to exemplary embodiments of the present invention.
Figure 6:
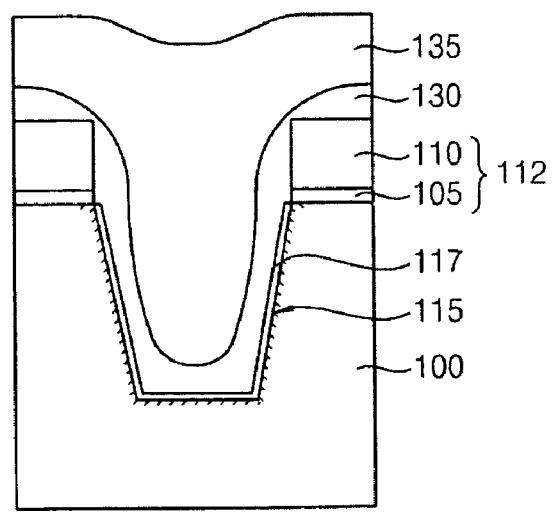
Figure 7:
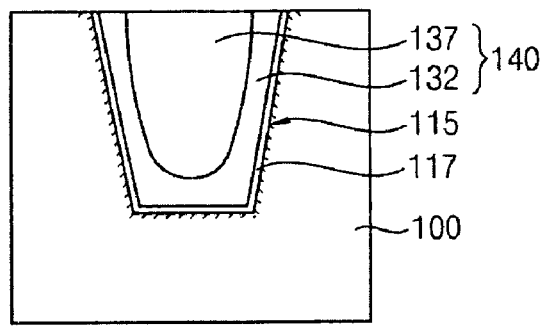

FIGS. 5 through 7 are cross-sectional views illustrating a method of forming an isolation layer according to exemplary embodiments of the present invention.

Referring to FIG. 5, the trench 115 may be formed in the substrate 100 using the mask pattern 112 as an etching mask, and then a liner layer 117 may be formed on a bottom and sidewalls of the trench 115. Formation of the trench 115 has been described with reference to FIG. 1. The liner layer 117 formed along the trench 115 may cure damage of the trench 115 and may suppress generation of leakage current.

In exemplary embodiments, the liner layer 117 may be formed on a bottom and sidewalls of the trench 115 by thermally treating the substrate 100 on which the trench 115 is formed. The mask pattern 112 may also be formed on the active region of the substrate 100. In other exemplary embodiments, the liner layer 117 may be formed by a film deposition process using oxide, nitride and/or oxynitride. In this case, the liner layer 117 may be formed on a bottom and sidewalls of the trench 115 and the mask pattern 112.

The liner layer 117 may have a thickness smaller than a thickness of the preliminary first insulation layer 120 subsequently formed on the liner layer 117. For example, a thickness of the liner layer 117 may have about 50% or less of a thickness of the preliminary first insulation layer 120. In other exemplary embodiments, a thickness of the liner layer 117 may have about 25% or less, about 20% or less, about 10% or less, or about 5% or less of a thickness of the preliminary first insulation layer 120. For example, the liner layer 117 may have a thickness of about 100 Å or less, or about 50 Å or less.

The preliminary first insulation layer 120 may be formed on the substrate 100 on which the liner layer 117 is formed. The preliminary first insulation layer 120 may be formed on a bottom and sidewalls of the trench 115 and the mask pattern 112. Formation of the preliminary first insulation layer 120 may be the same as described with reference to FIG. 2.

Referring to FIG. 6, a plasma treatment may be performed on the preliminary first insulation layer 120 using fluorine-containing plasma to form the first insulation layer 130 including fluorine, and then the second insulation layer 135 may be formed on the first insulation layer 130 to fill the trench 115. Fluorine included in the first insulation layer 130 may accelerate deposition or growth of an insulation layer (e.g., an oxide or an oxynitride) on a portion of the substrate 100 adjacent to the trench 115, and thus a portion the insulation layer adjacent the first insulation layer 130 may have a thickness larger than a thickness of a portion of the insulation layer spaced apart from the first insulation layer 130.

In exemplary embodiments, a thermal treatment may be performed on the substrate 100 on which the first insulation layer 130 and the second insulation layer 135 are formed. During the thermal treatment process, fluorine of the first insulation layer 130 may move toward an adjacent portion of the substrate 100 so that a surface of the substrate 100 positioned at upper edges, sidewalls and/or a bottom of the trench 115 may be fluorinated.

Referring to FIG. 7, upper portions of the second insulation layer 135 and the first insulation layer 130 and the mask pattern 112 may be removed from the substrate 100 so that a portion of the substrate 100 may be exposed. By removing the upper portions of the second insulation layer 135 and the first insulation layer 130, an isolation layer 140 including a second insulation layer pattern 137 and a first insulation layer pattern 132 may be formed in the trench 115.

FIGS. 8 through 14 are cross-sectional views illustrating a method of manufacturing a semiconductor device according to exemplary embodiments. FIGS. 9A, 10A, 11A, 12A and 13A are cross-sectional views taken along an AA' line of FIG. 8, and FIGS. 9B, 10B, 11B, 12B and 13B are cross-sectional views taken along a BB' line of FIG. 8.

Figure 8:
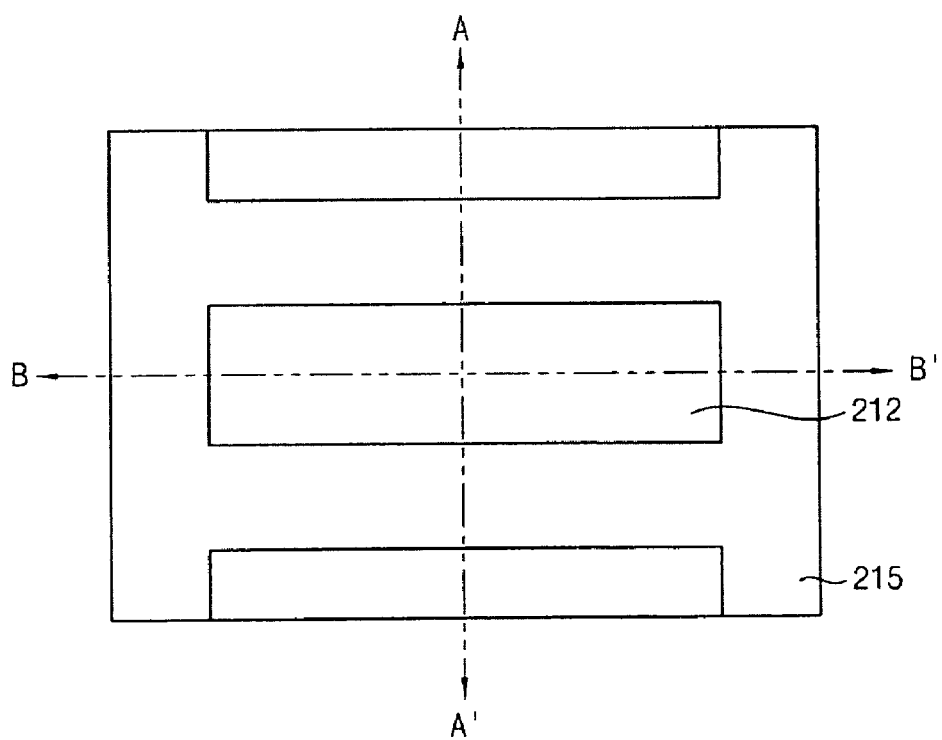
FIGS. 8 through 14 are cross-sectional views illustrating a method of manufacturing a semiconductor device according to exemplary embodiments.
Figure 9A:
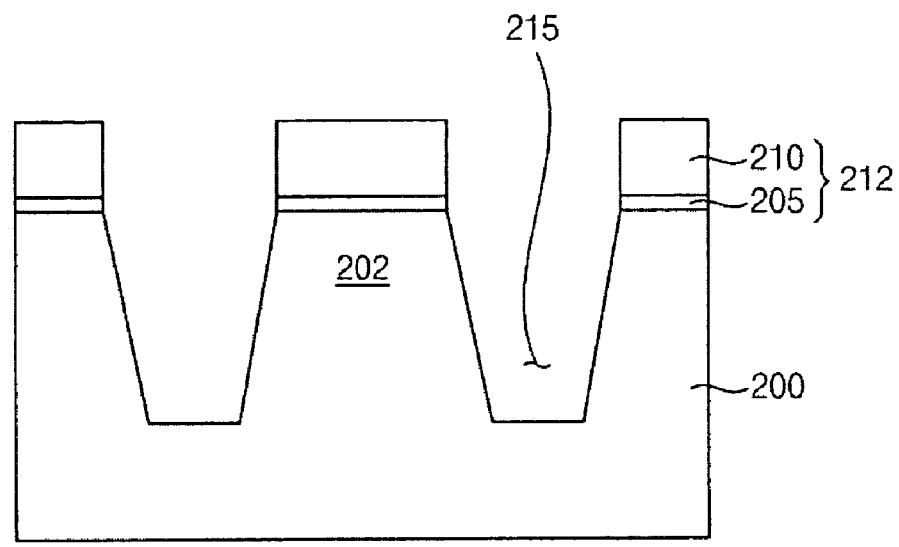
Figure 9B:
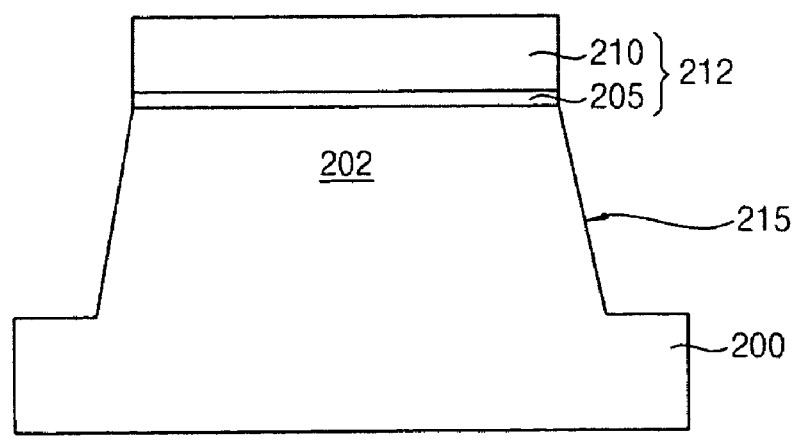

Referring to FIGS. 8, 9A and 9B, a mask pattern 212 may be formed on an active region 202 of the substrate 200. Using the mask pattern 212 as an etching mask, a trench 215 may be formed in the substrate 200. The active region 202 of the substrate 200 and the mask pattern 212 may extend or be lengthwise in a BB' direction. In exemplary embodiments, the mask pattern 212 may include a pad oxide layer pattern 205 and a pad nitride layer pattern 210. An isolation layer may be formed in the trench 215 to define the active region 202 and a field region of the substrate 200. Descriptions of the substrate 200, the mask pattern 212 and the trench 215 may be the same as described with reference to FIG. 1.

Figure 10A:
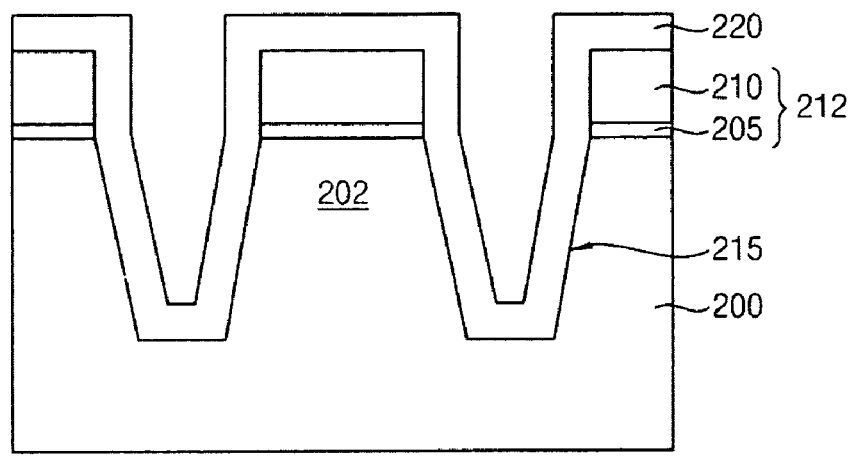
Figure 10B:
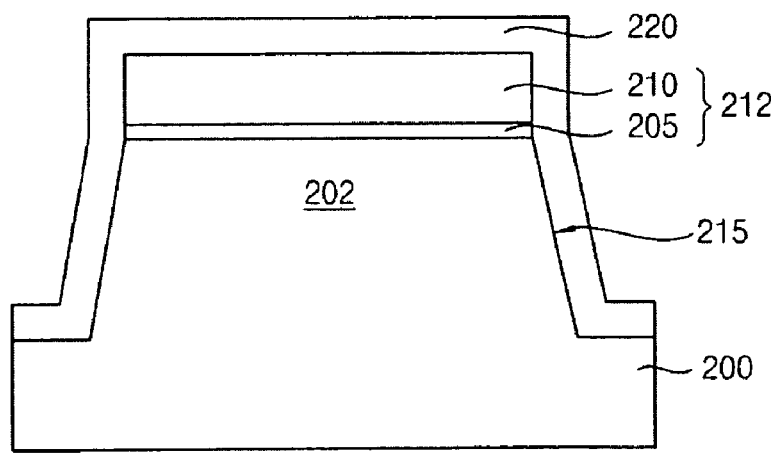

Referring to FIGS. 10A and 10B, a preliminary first insulation layer 220 may be formed on a bottom and sidewalls of the trench 215 and the mask pattern 212. The preliminary first insulation layer 220 may be formed along profiles or surfaces of the trench 215 and the mask pattern 212 by incompletely filling the trench 215 with an insulation material. In exemplary embodiments, the preliminary first insulation layer 220 may be formed using $O_3$-tetraethyl orthosilicate ($O_3$-TEOS). For example, the preliminary first insulation layer 220 may be formed by depositing $O_3$-TEOS using a sub-atmospheric CVD process. In other exemplary embodiments, the preliminary first insulation layer 220 may be formed using an oxide (PSG, BPSG, USG, SOG, TEOS, PE-TEOS and/or HDP-CVD oxide). In still other exemplary embodiments, the preliminary first insulation layer 220 may be formed to include silicon oxide, silicon oxynitride, silicon nitride or combinations thereof.

In exemplary embodiments, a liner layer (not illustrated) may be optionally formed on a bottom and sidewalls of the trench 215 before forming the preliminary first insulation layer 220. The liner layer may cure damage of the trench 215 and the substrate 200, and/or may reduce generation of a leakage current near the trench 215. The liner layer may be formed to have a thickness small than a thickness of the preliminary first insulation layer 220.

Figure 11A:
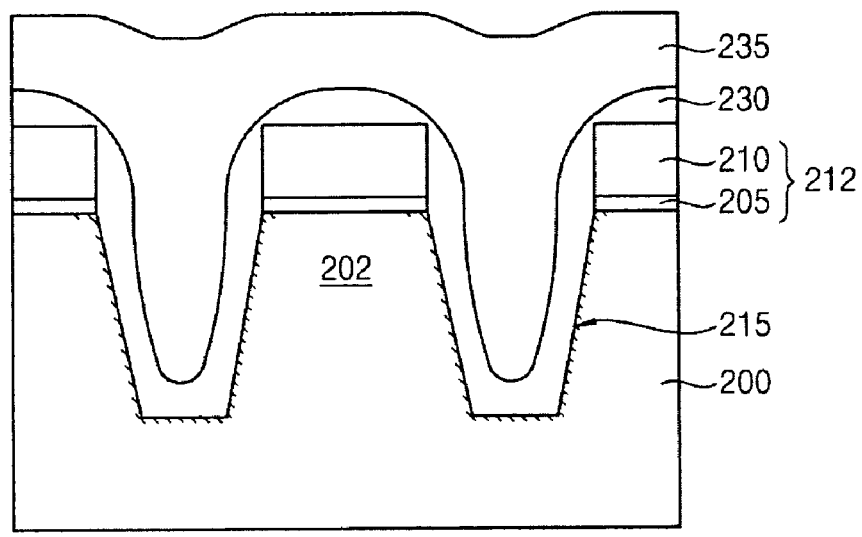
Figure 11B:
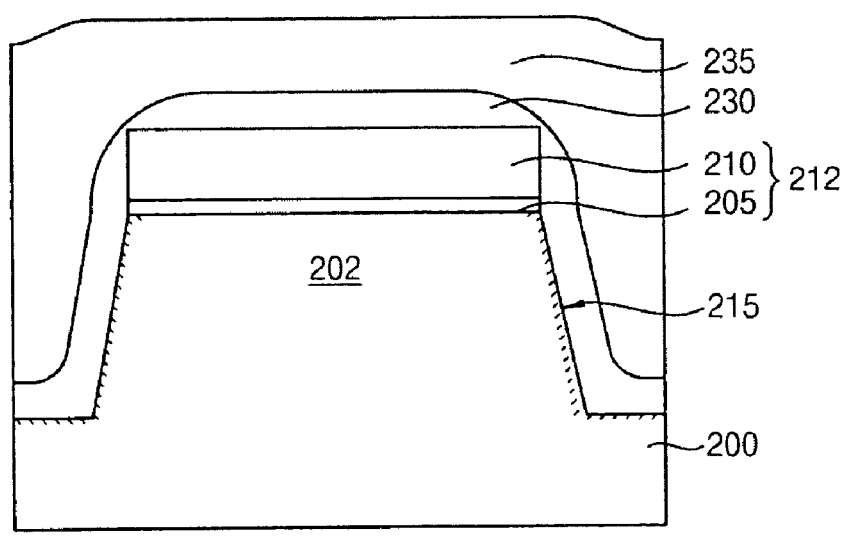

Referring to FIGS. 11A and 11B, a fluorine plasma treatment may be performed on the substrate 200 on which the trench 215 and the preliminary first insulation layer 220 may be formed. By treating the preliminary first insulation layer 220 with fluorine-containing plasma, the preliminary first insulation layer 220 may be converted into a first insulation layer 230 including fluorine. In exemplary embodiments, $NF_3$ gas plasma may be used in the plasma treatment. In other exemplary embodiments, $CF_x$ gas plasma or $SF_6$ plasma may be used in the plasma treatment. In the $NF_3$ gas plasma, nitrogen and fluorine may be readily separated, and thus fluorine may be efficiently inserted into the preliminary first insulation layer 220.

In exemplary embodiments, the preliminary first insulation layer 220 may be partially removed by the fluorine plasma treatment. As a result, the first insulation layer 230 may have a thickness smaller than that of the preliminary first insulation layer 220. A thickness reduction of the preliminary first insulation layer 220 may be concentrated on a portion adjacent to upper edges of the trench 215 while treating the preliminary first insulation layer 220 with fluorine plasma. Thus, the first insulation layer 230 formed by performing the fluorine plasma treatment may have a relatively small thickness near the upper edge portion of the trench 215. Further, an entrance of a space in the trench 215 in which the preliminary first insulation layer 220 is formed may be enlarged by the fluorine plasma treatment, and a second insulation layer 235 may be readily formed on the first insulation layer 230 and in the trench 215 through the enlarged entrance, and generation of a void in the trench 215 having a high aspect ratio may be reduced.

The second insulation layer 135 may be formed on the first insulation layer 230 to fill the trench 215 of the substrate 200. The second insulation layer 235 may be formed using an insulation material the same as or different from that of the preliminary first insulation layer 220. In some exemplary embodiments, a thermal treatment may be performed on the substrate 200 on which the first insulation layer 230 and the second insulation layer 235 are formed. Due to thermal activation, fluorine contained in the first insulation layer 230 thinly formed along an inner wall (including upper edges, sidewalls and/or a bottom) of the trench 215 may move to an adjacent surface of the substrate 200 and the trench 215, and especially may reach up to an upper edge portion of the trench. Fluorine components existing near the upper edge portion of the trench and the first insulation layer may accelerate growth or deposition of a gate insulation layer formed near the upper edge portion of the trench. Therefore, a thickness of an edge portion of the gate insulation layer may selectively increase to reduce generation of leakage current. Description of the first insulation layer 230 and the second insulation layer 235 may be the same as described with reference to FIG. 2.

Fluorinating the trench 215 may be performed by an ion implantation process in other embodiments. In a fluorine ion implantation, fluorine ion may be implanted into the trench 215 directly or through an intermediate insulation layer. However, doped fluorine that excessively remains on the substrate 200 may be contaminants causing malfunction of a device. A dose amount and/or energy of ion implantation may not be precisely controlled, and the substrate 200 or the trench 215 may be unintentionally damaged. Further, a thickness of the preliminary first insulation layer 220 may not be substantially reduced by the ion implantation process, and entrance of the trench 215 in which the preliminary first insulation layer 220 formed may not be enlarged. Therefore, the relatively small entrance of the trench 215 may be readily blocked while forming a second insulation layer 235 in the trench 215 and a void may be formed in the second insulation layer 235.

Figure 12A:
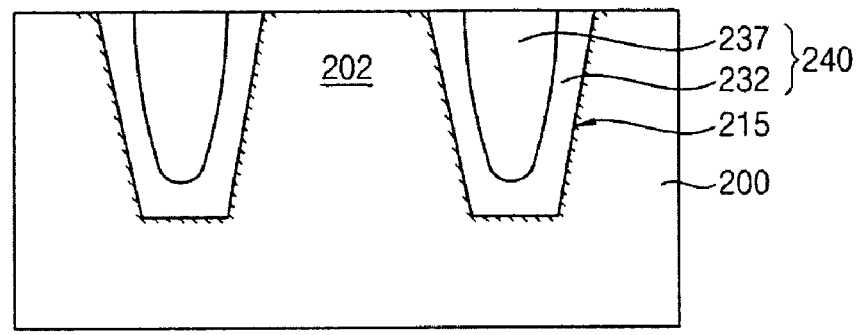
Figure 12B:
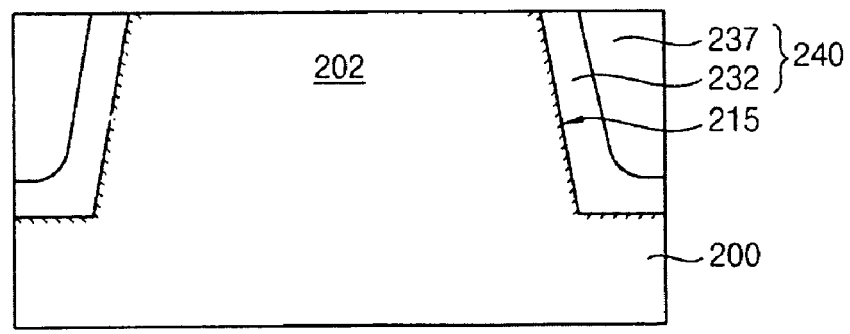

Referring to FIGS. 12A and 12B, upper portions of the second insulation layer 235 and the first insulation layer 230 and the mask pattern 212 may be removed from the substrate 200 so that a portion of the substrate 200 may be exposed. By removing the upper portions of the second insulation layer 235 and the first insulation layer 230, an isolation layer 240 including a second insulation layer pattern 237 and a first insulation layer pattern 232 may be formed in the trench 215. In exemplary embodiments, removing the upper portions of the second insulation layer 235 and the first insulation layer 230 and the mask pattern 212 may be performed by a planarization process, a wet etching process and/or a dry etching process. Explanations on the formation of the isolation layer 240 may be the same as described with reference to FIG. 4.

Figure 13A:
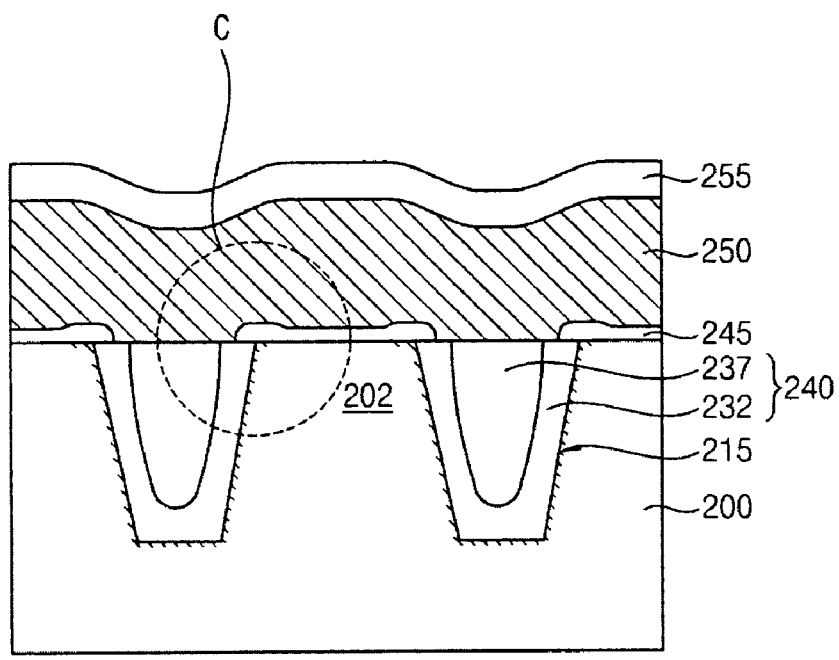
Figure 13B:
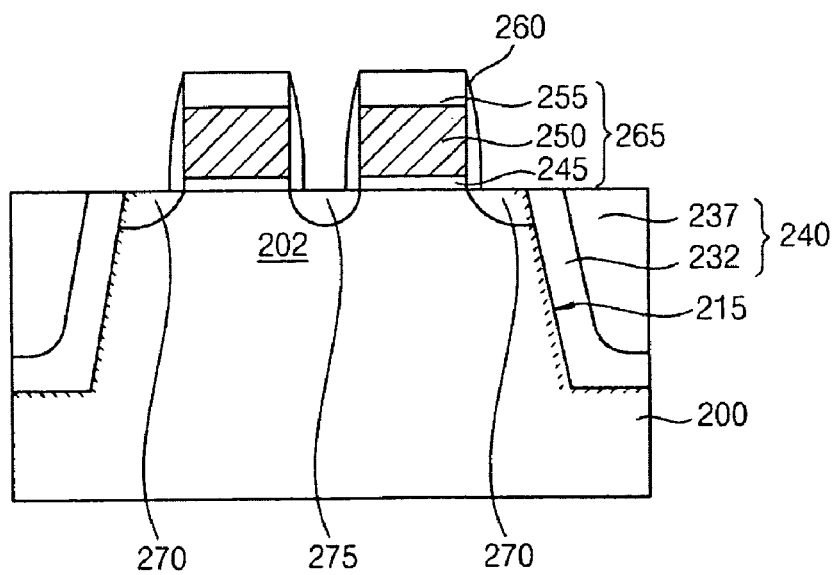

Referring to FIGS. 13A and 13B, a gate insulation layer 245 may be formed on the exposed portion (e.g., the active region 202) of the substrate 200. In some exemplary embodiments, the gate insulation layer 245 may be formed by a thermal oxidation process. In other exemplary embodiments, the gate insulation layer 245 may be formed by depositing an insulation material (e.g., silicon oxide, silicon oxynitride, high dielectric material, metal oxide, etc.) on the substrate 200. In some exemplary embodiments, the gate insulation layer 245 may be formed to have a thickness of at least about 20 nm. In other exemplary embodiments, the gate insulation layer 245 may be formed to have a thickness of at least about 15 nm.

Figure 14:
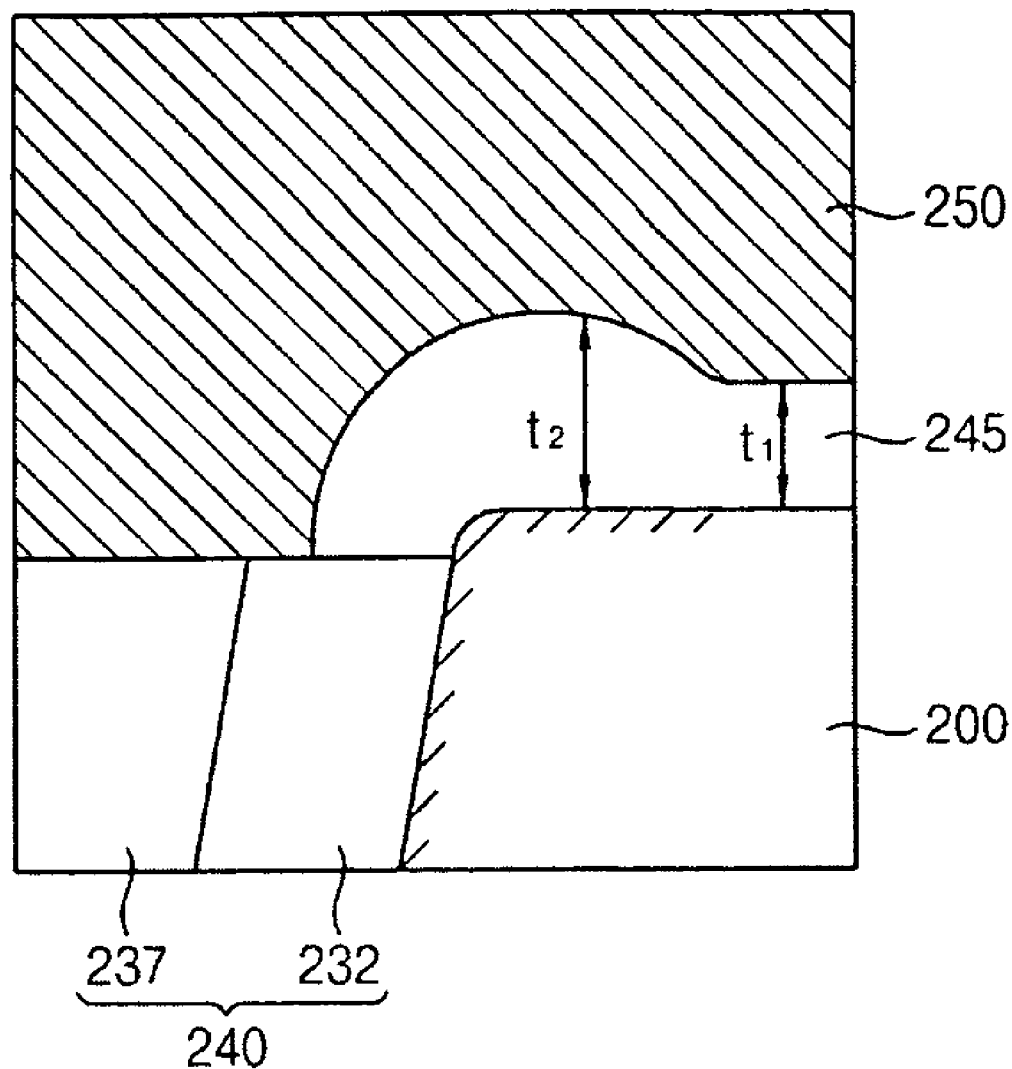

FIG. 14 is an enlarged cross-sectional view illustrating the 'C' portion of FIG. 13A. Referring to FIG. 14, the gate insulation layer 245 may include a center portion having a first thickness $t_1$ and an edge portion having a second thickness $t_2$. The center portion and the edge portion of the gate insulation layer 245 may be defined in the AA' direction. The second thickness $t_2$ of the edge portion may be larger than the first thickness $t_1$ of the center portion. Fluorine existing on a surface of upper edges of the trench 215 may selectively accelerate growth or deposition of the edge portion of the gate insulation layer 245. Thus, the edge portion of the gate insulation layer 245 may be selectively thickened. The gate insulation layer 245 having a relatively large thickness may reduce or suppress generation of a leakage current.

Referring to FIGS. 13A and 13B, a gate conductive layer 250 and a gate mask layer 255 may be formed on the substrate 200 on which the gate insulation layer 245 is formed. The gate conductive layer 250 may be formed using a conductive material (e.g., polysilicon doped with impurities, metal, conductive metal nitride and/or conductive metal silicide). The gate conductive layer 250 may be a single layer or a multi-layer. The gate mask layer 255 may be provided as a mask for patterning a gate structure. The gate mask layer may be formed using a material (e.g., nitride, oxide and/or oxynitride) having an etching selectivity relative to the gate conductive layer. In exemplary embodiments, a photoresist pattern may be formed on the gate mask layer 255, and then the gate mask layer 255 may be partially etched. The gate conductive layer 250 and the gate insulation layer 245 may be sequentially patterned using the patterned gate mask layer 255 to form a gate structure 265 on the substrate 200. A gate spacer 260 may be formed on sidewalls of the gate structure 265. The gate structure may have a line width of about 50 nm or less, or about 45 nm or less.

In exemplary embodiments, the gate structure 265 may have a line shape lengthwise in the AA' direction perpendicular the BB' direction in which the active region 202 may extend. As noted by FIG. 13A which illustrates a cross-sectional view taken along the AA' direction, the gate structure 265 may include the gate insulation layer 245 having the edge portion thicker than the center portion. The gate insulation layer having a relatively thick edge portion may reduce generation of leakage current.

Source/drain regions 270 and 275 may be formed on a portion of the substrate adjacent to the gate structure 265 by doping with impurities. Accordingly, a transistor including the gate structure 265 and the source/drain regions 270 and 275 may be formed on the substrate 200.

Exemplary embodiments with regard to a method of forming a transistor including the gate insulation layer 245, the gate conductive layer 250 and the gate mask layer 260 sequentially stacked have been described. In other exemplary embodiments, a flash memory device may be manufactured by using the gate insulation layer 245 as a tunnel oxide layer, and by forming a floating gate, a dielectric layer and a control gate on the tunnel oxide layer.

According to exemplary embodiments, an isolation layer that includes a first insulation layer having fluorine may be formed by performing a fluorine plasma treatment on a thin insulation layer formed along an inner wall of a trench. Due to thermal activation, fluorine contained in the first insulation layer may move to an adjacent surface of the substrate and the trench, and especially may reach up to an upper edge portion of the trench. Fluorine components existing near the upper edge portion of the trench and the first insulation layer may accelerate growth or deposition of a gate insulation layer formed near the upper edge portion of the trench. Therefore, a thickness of an edge portion of the gate insulation layer may selectively increase to reduce generation of leakage current.

Further, the first insulation layer formed by performing the fluorine plasma treatment may have a relatively small thickness near the upper edge portion of the trench. Therefore, a second insulation layer may be formed on the first insulation layer to readily fill the trench with suppressing generation of a void in the trench.

The foregoing is descriptive of exemplary embodiments and is not to be construed as limiting thereof. Although a few exemplary embodiments have been described, those skilled in the art will readily appreciate that many modifications are possible in the exemplary embodiments without materially departing from the novel teachings of exemplary embodiments. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it may be to be understood that the foregoing may be illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. A method of manufacturing a semiconductor device, comprising:
   forming a mask pattern on an active region of a substrate;
   removing an exposed portion of the substrate to form a trench in the substrate;
   forming a preliminary first insulation layer on a bottom and sidewalls of the trench and the mask pattern;
   performing a plasma treatment on the preliminary first insulation layer using fluorine-containing plasma to form a first insulation layer including fluorine;
   forming a second insulation layer on the first insulation layer to fill the trench;
   removing upper portions of the second insulation layer and the first insulation layer, and the mask pattern until the active region of the substrate is exposed; and
   forming a gate insulation layer on the exposed active region of the substrate and on the first insulation layer,
   wherein the gate insulation layer has a center portion having a first thickness on the active region of the substrate and an edge portion having a second thickness larger than the first thickness on a top surface of the first insulation layer, and
   wherein the gate insulation layer having the center portion and the edge portion is a continuous layer.

2. The method of claim 1, wherein performing a plasma treatment on the preliminary first insulation layer further comprises:
   removing a portion of the preliminary first insulation layer near an upper edge of the trench.

3. The method of claim 1, wherein a thickness of a first portion of the first insulation layer near the upper edge of the trench is smaller than a thickness of a second portion of the first insulation layer near a bottom of the trench.

4. The method of claim 1, further comprising:
   performing a thermal treatment on the substrate on which the first insulation layer is formed so that a surface and an upper edge of the trench is fluorinated.

5. The method of claim 1, wherein the fluorine-containing plasma comprises $NF_3$ gas plasma.

6. The method of claim 1, wherein the preliminary first insulation layer is formed using $O_3$-tetraethyl orthosilicate.

7. The method of claim 6, wherein the preliminary first insulation layer is formed by a sub atmospheric chemical vapor deposition process.

8. The method of claim 1, wherein the first insulation layer has a thickness of about 800 Å or less.

9. The method of claim 6, wherein the second insulation layer is formed using $O_3$-tetraethyl orthosilicate.

10. The method of claim 1, further comprising:
    forming a liner layer on a bottom and sidewalls of the trench, before forming the preliminary first insulation layer in the trench.

11. The method of claim 10, wherein the liner layer has a thickness of about 100 Å or less.

12. A method of manufacturing a semiconductor device, comprising:
    forming a mask pattern on an active region of a substrate, the active region lengthwise in a first direction;
    removing an exposed portion of the substrate to form a trench in the substrate;
    forming a preliminary first insulation layer on a bottom and sidewalls of the trench and the mask pattern;
    performing a plasma treatment on the preliminary first insulation layer using fluorine-containing plasma to form a first insulation layer including fluorine;
    forming a second insulation layer on the first insulation layer to fill the trench;
    performing a thermal treatment on the substrate on which the first insulation layer and the second insulation layer are formed;

planarizing upper portions of the second insulation layer and the first insulation layer, and the mask pattern until the active region of the substrate is exposed;

forming a gate insulation layer on the exposed active region of the substrate and on the planarized surface of the first insulation layer, the gate insulation layer including a center portion and an edge portion in a second direction perpendicular the first direction;

forming a gate conductive layer on the gate insulation layer; and patterning the gate conductive layer and the gate insulation layer to form a gate structure lengthwise in the second direction, wherein the center portion of the gate insulation layer has a first thickness on the active region of the substrate, and the edge portion of the gate insulation layer has a second thickness larger than the first thickness on the first insulation layer, and wherein the gate insulation layer having the center portion and the edge portion is a continuous layer.

13. The method of claim 12, wherein the thermal treatment is performed at a temperature sufficient for fluorinating a surface and an upper edge of the trench.

14. The method of claim 12, wherein a thickness of a first portion of the first insulation layer near the upper edge of the trench is smaller than a thickness of a second portion of the first insulation layer near a bottom of the trench.

15. The method of claim 12, wherein the gate structure has a line width of about 50 nm or less.

* * * * *